United States Patent
Tung et al.

(10) Patent No.: US 9,496,361 B1
(45) Date of Patent: Nov. 15, 2016

(54) SELECTIVELY DEPOSITED METAL GATES AND METHOD OF MANUFACTURING THEREOF

(71) Applicant: UNITED MICROELECTRONICS CORP., Hsin-Chu (TW)

(72) Inventors: Yu-Cheng Tung, Kaohsiung (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/869,987

(22) Filed: Sep. 29, 2015

(30) Foreign Application Priority Data

Aug. 27, 2015 (TW) .............................. 104128060 A

(51) Int. Cl.
| | | |
|---|---|---|
| *H01L 21/336* | (2006.01) | |
| *H01L 21/28* | (2006.01) | |
| *H01L 29/49* | (2006.01) | |
| *H01L 29/78* | (2006.01) | |
| *H01L 29/417* | (2006.01) | |
| *H01L 29/40* | (2006.01) | |
| *H01L 29/51* | (2006.01) | |
| *H01L 21/8238* | (2006.01) | |
| *H01L 29/423* | (2006.01) | |

(52) U.S. Cl.
CPC ..... *H01L 29/4958* (2013.01); *H01L 21/28088* (2013.01); *H01L 21/28114* (2013.01); *H01L 21/823842* (2013.01); *H01L 29/401* (2013.01); *H01L 29/42376* (2013.01); *H01L 29/4966* (2013.01); *H01L 29/513* (2013.01); *H01L 29/495* (2013.01)

(58) Field of Classification Search
CPC ............... H01L 21/823842; H01L 21/76877; H01L 29/66545; H01L 29/4966; H01L 29/4236; H01L 29/66621
See application file for complete search history.

(56) References Cited

U.S. PATENT DOCUMENTS

| | | | |
|---|---|---|---|
| 7,560,381 B2 | 7/2009 | Nopper | |
| 7,741,219 B2 | 6/2010 | Chikarmane | |
| 7,872,316 B2 * | 1/2011 | Iwata | H01L 21/28097 257/288 |
| 8,120,114 B2 | 2/2012 | Ott | |
| 8,530,317 B1 * | 9/2013 | Wu | H01L 29/4232 257/314 |
| 2013/0069161 A1 | 3/2013 | Yang | |
| 2014/0103404 A1 * | 4/2014 | Li | H01L 21/82384 257/288 |
| 2014/0299939 A1 * | 10/2014 | Kim | H01L 21/02697 257/369 |
| 2015/0170961 A1 | 6/2015 | Romero | |
| 2015/0171086 A1 | 6/2015 | Cai | |

* cited by examiner

*Primary Examiner* — Victor A Mandala
*Assistant Examiner* — Regan J Rundio
(74) *Attorney, Agent, or Firm* — Winston Hsu; Scott Margo

(57) ABSTRACT

A manufacturing method of a semiconductor structure includes the following steps. Gate trenches are formed in a first dielectric layer on a semiconductor substrate. A sidewall spacer layer is formed on the semiconductor substrate and on at least two sides of each gate trench. A plurality of first metal gates is formed on the semiconductor substrate. Each of the first metal gates includes an upper part and a lower part connected to the upper part, the lower part is formed in one of the gate trenches, and the upper part covers at least a part of the sidewall spacer layer in a vertical direction. The upper part and the lower part of the first metal gate are formed by an identical process together.

20 Claims, 14 Drawing Sheets

US 9,496,361 B1

SELECTIVELY DEPOSITED METAL GATES AND METHOD OF MANUFACTURING THEREOF

BACKGROUND OF THE INVENTION

1. Field of the Invention

The present invention relates to a semiconductor structure and a manufacturing method thereof, and more particularly, to a semiconductor structure including metal gates at least partially formed by a selective metal deposition process and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For instance, it is more difficult to form a source/drain contact between gate electrodes when the spacing between the gate electrodes becomes smaller. In addition, the gate electrode may be exposed easily during the etching process for forming an opening in an isolation material between the gate electrodes, and a short circuit may occur between the exposed gate electrode and a source/drain contact subsequently formed. Therefore, it is necessary to modify the process and the structural design for improving related process window and enhancing production yield.

SUMMARY OF THE INVENTION

A manufacturing method of a semiconductor structure is provided in an embodiment of the present invention. The manufacturing method includes the following steps. A plurality of gate trenches are formed in a first dielectric layer on a semiconductor substrate. A sidewall spacer layer is formed on the semiconductor substrate and on at least two sides of each gate trench. A plurality of first metal gates are formed on the semiconductor substrate. Each of the first metal gates includes an upper part and a lower part connected to the upper part, the lower part is formed in one of the gate trenches, and the upper part covers at least apart of the sidewall spacer layer in a vertical direction. The upper part and the lower part of the first metal gate are formed by an identical process together.

A semiconductor structure is provided in an embodiment of the present invention. The semiconductor structure includes a semiconductor substrate and a gate structure. The gate structure is disposed on the semiconductor substrate. The gate structure includes a work function layer, a first metal gate, and a second metal gate. The second metal gate is disposed on the work function layer. The first metal gate is disposed on the second metal gate. A width of the first metal gate is larger than a width of the second metal gate, a topmost surface of the first metal gate is coplanar with a topmost surface of a first dielectric layer disposed on a side of the gate structure, and a topmost surface of the second metal gate is higher than a topmost surface of the work function layer.

In the manufacturing method of the semiconductor structure of the present invention, the upper part of the first metal gate covers the sidewall spacer layer in the vertical direction so as to protect the sidewall spacer layer from a subsequent process of forming a source/drain contact. The sidewall spacer layer will not be over etched, and a short circuit between the gate structure and the source/drain contact may be avoided accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor structure according to a first embodiment of the present invention, wherein FIG. 2 is a schematic drawing illustrating a condition of another gate trench according to the manufacturing step of FIG. 1, FIG. 3 is a schematic drawing in a step subsequent to FIG. 1, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7-11 are schematic drawings illustrating a manufacturing method of a semiconductor structure according to a second embodiment of the present invention, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

FIG. 12 and FIG. 13 are schematic drawings illustrating a manufacturing method of a semiconductor structure according to a third embodiment of the present invention, wherein FIG. 13 is a schematic drawing in a step subsequent to FIG. 12.

DETAILED DESCRIPTION

Figure 1:
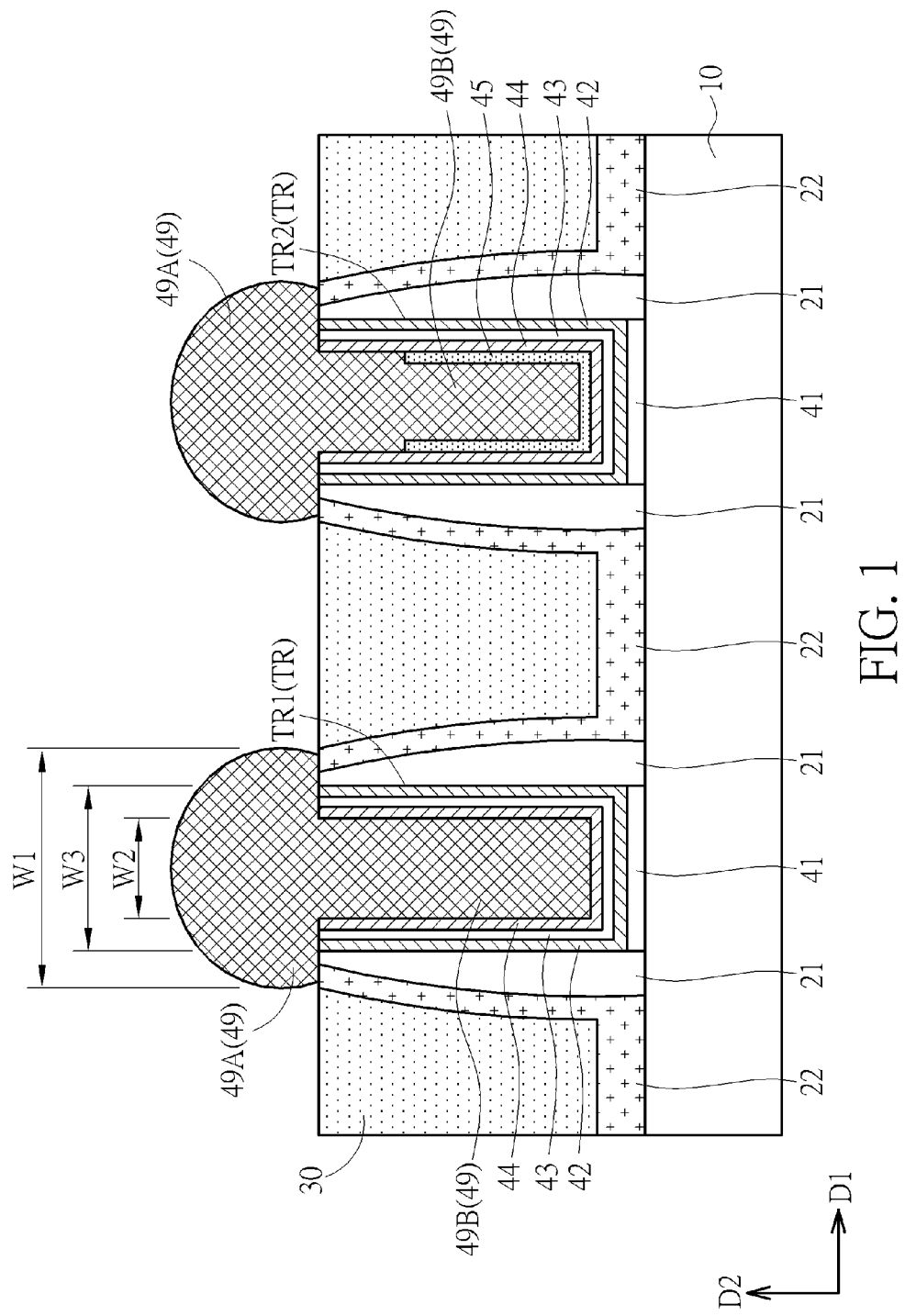

Please refer to FIGS. 1-6. FIGS. 1-6 are schematic drawings illustrating a manufacturing method of a semiconductor structure according to a first embodiment of the present invention. The manufacturing method of the semiconductor structure in this embodiment includes the following steps. As shown in FIG. 1, a plurality of gate trenches TR are formed in a first dielectric layer 30 on a semiconductor substrate 10. The gate trenches TR in this embodiment may be formed by a replacement metal gate (RMG) process for example. A plurality of dummy gates (not shown) may be formed on the semiconductor substrate 10 first. A sidewall spacer layer 21, a contact etching stop layer (CESL) 22, and the first dielectric layer 30 may then be formed to cover the dummy gates and the semiconductor substrate 10. A chemical mechanical polish (CMP) process may then be performed to expose the dummy gates, and the dummy gates are removed for forming the gate trenches TR. Therefore, the sidewall spacer layer 21 and the contact etching stop layer 22 are formed on the semiconductor substrate 10 and at least two sides of each of the gate trenches TR, and the first dielectric layer 30 is formed between the gate trenches TR. In this embodiment, the gate trenches TR may include a first gate trench TR1 and a second gate trench TR2 for forming gates of field effect transistors (FETs) with different conductivity types respectively, such as a gate of a N-type FET and a gate of a P-type FET, but not limited thereto. Subsequently, a plurality of first metal gates 49 are formed on the semiconductor substrate 10. Each of the first metal gates 49 includes an upper part 49A and a lower part 49B connected to the upper part 49A. The lower part 49B is formed in one of the gate trenches TR, and the upper part 49A covers at least a part of the sidewall spacer layer 21 and the contact etching stop layer 22 in a vertical direction D2. The upper part 49A and the lower part 49B of the first metal gate 49 are formed by an identical process together. The lower part 49B is formed in the gate trench TR, and the upper part 49A is formed outside the gate trench TR. Additionally, a high-k dielectric layer 42, a barrier layer 43, and a work function layer may be formed and stacked in each of the gate trenches TR before the step of forming the first metal gates 49. Different kinds of work function layers may be formed when the first gate trench TR1 and the second gate trench TR2 are used to form gates of FETs with different conductivity types respectively. For example, a first work function layer 44 may be formed in the first gate trench TR1 and the second gate trench TR2, and a second work function layer 45 may be formed on the first work function layer 44 in the second gate trench TR2, but not limited thereto. In other embodiments of the present invention, the first gate trench TR1 and the second gate trench TR2 may also be used to form the gates of the FETs with the same conductivity type, and a source/drain structure (not shown) between the first gate trench TR1 and the second gate trench TR2 are shared by these two FETs.

The first work function layer 44 and the second work function layer 45 may respectively include titanium nitride (TiN), titanium carbide (TiC), tantalum nitride (TaN), tantalum carbide (TaC), tungsten carbide (WC), titanium trialuminide (TiAl$_3$), or aluminum titanium nitride (TiAlN), but not limited thereto. The high-k dielectric layer 42 may be selected from a group including hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalite (SrBi$_2$Ta$_2$O$_9$, SBT), lead zirconate titanate (PbZr$_x$Ti$_{1-x}$, PZT), and barium strontium titanate (Ba$_x$Sr$_{1-x}$TiO$_3$, BST). Additionally, the semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 may also have a fin structure (not shown), and the gate trenches TR may be formed on the fin structure of the semiconductor substrate 10. In addition, an interfacial layer 41 may also be selectively formed between the high-k dielectric layer 42 and the semiconductor substrate 10, and the interfacial layer 41 may include a silicon oxide layer, but not limited thereto.

It is worth noting that the first metal gates 49 in this embodiment are formed by a selective metal deposition process, such as an electroless deposition process preferably, but not limited thereto. Accordingly, the upper part 49A and the lower part 49B of each first metal gate 49 are formed monolithically and connected with one another. In the selective metal deposition process, the deposited metal material is only formed on the exposed metal surface, such as the exposed first work function layer 44 and the exposed second work function layer 45, and the deposited metal material will not be directly deposited on the insulating material, such as the first dielectric layer 30. Therefore, the lower part 49B formed in the gate trench TR and the upper part 49A outside the gate trench TR with a wider width as shown in FIG. 1 may be formed by adjusting the process parameters and the process time of the selective metal deposition process. The material of the first metal gates 49 formed by the selective metal deposition process may be selected form a metal material group including cobalt (Co), manganese (Mn), chromium (Cr), iron (Fe), nickel (Ni), ruthenium (Ru), molybdenum (Mo), and tungsten (W) or other suitable metal materials. The first metal gate 49 may have a mushroom shape, and the upper part 49A may be regarded as a pileus part. The upper part 49A may be used to cover and protect the sidewall spacer layer 21 and the contact etching stop layer 22 on the sides of each gate trenches TR. Accordingly, in each of the first metal gates 49, a width of the upper part 49A (such as a first width W1 shown in FIG. 1) is larger than a width of the lower part 49B (such as a second width W2 shown in FIG. 1) in a horizontal direction D1, and the first width W1 of the upper part 49A is larger than a width of the gate trench TR (such as a third width W3 shown in FIG. 1). Additionally, the upper parts 49A are separated from one another, and each of the upper parts 49A directly contacts and covers a part of the sidewall spacer layer 21 and the contact etching stop layer 22 preferably.

Figure 2:
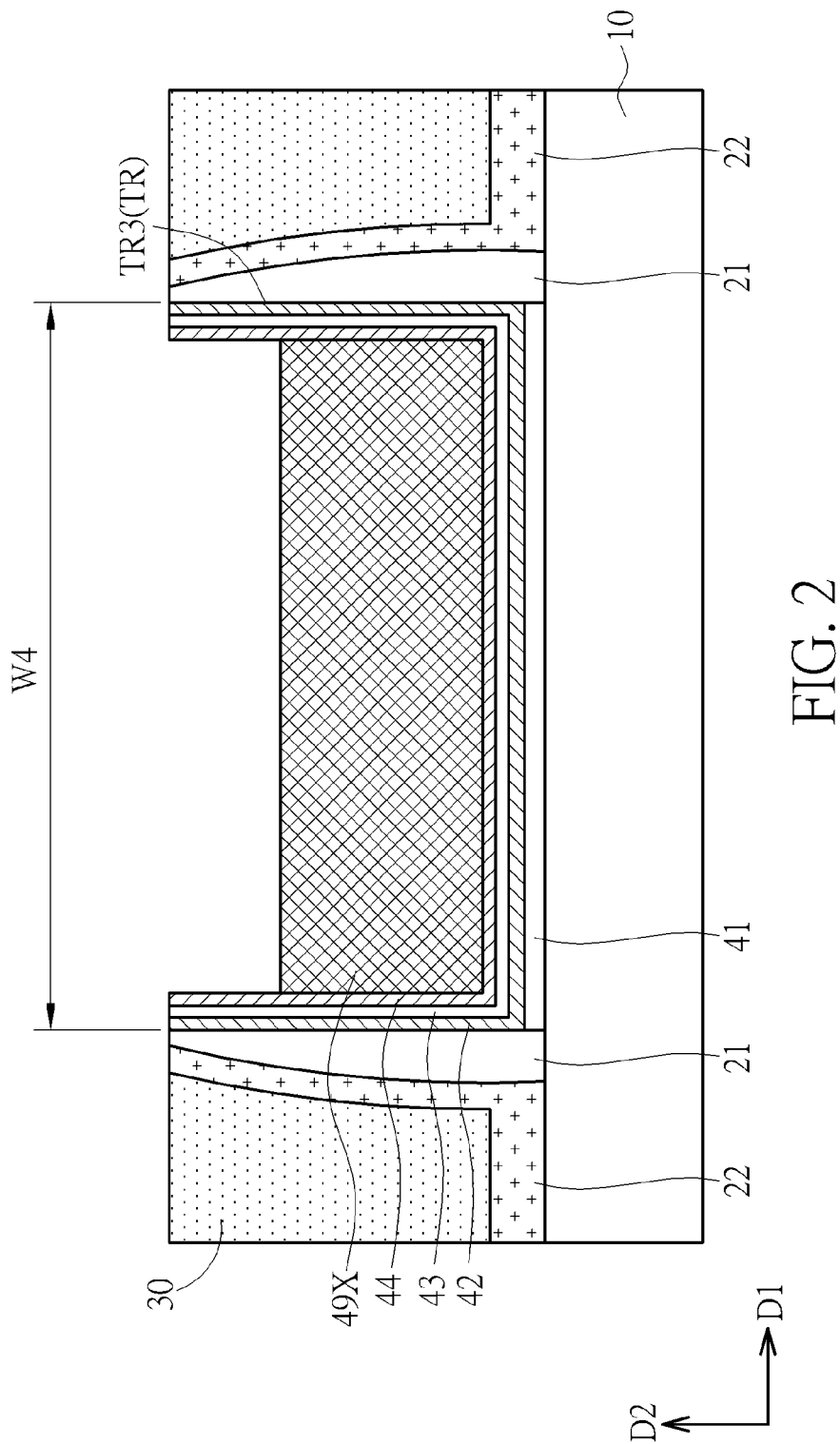

As shown in FIG. 2, a third gate trench TR3 with relatively larger width may also be selectively formed on the semiconductor substrate 10. The third gate trench TR3 may be used to form other units such as a resistor, but not limited thereto. The third gate trench TR3 has a fourth width W4 in the horizontal direction D1, and the fourth width W4 is larger than the third width shown in FIG. 1. A metal block 49X may be formed in the third gate trench TR3 after the selective metal deposition process described above and the third gate trench TR3 may not be filled with the deposited metal material because the third gate trench TR3 is relatively larger.

Figure 3:
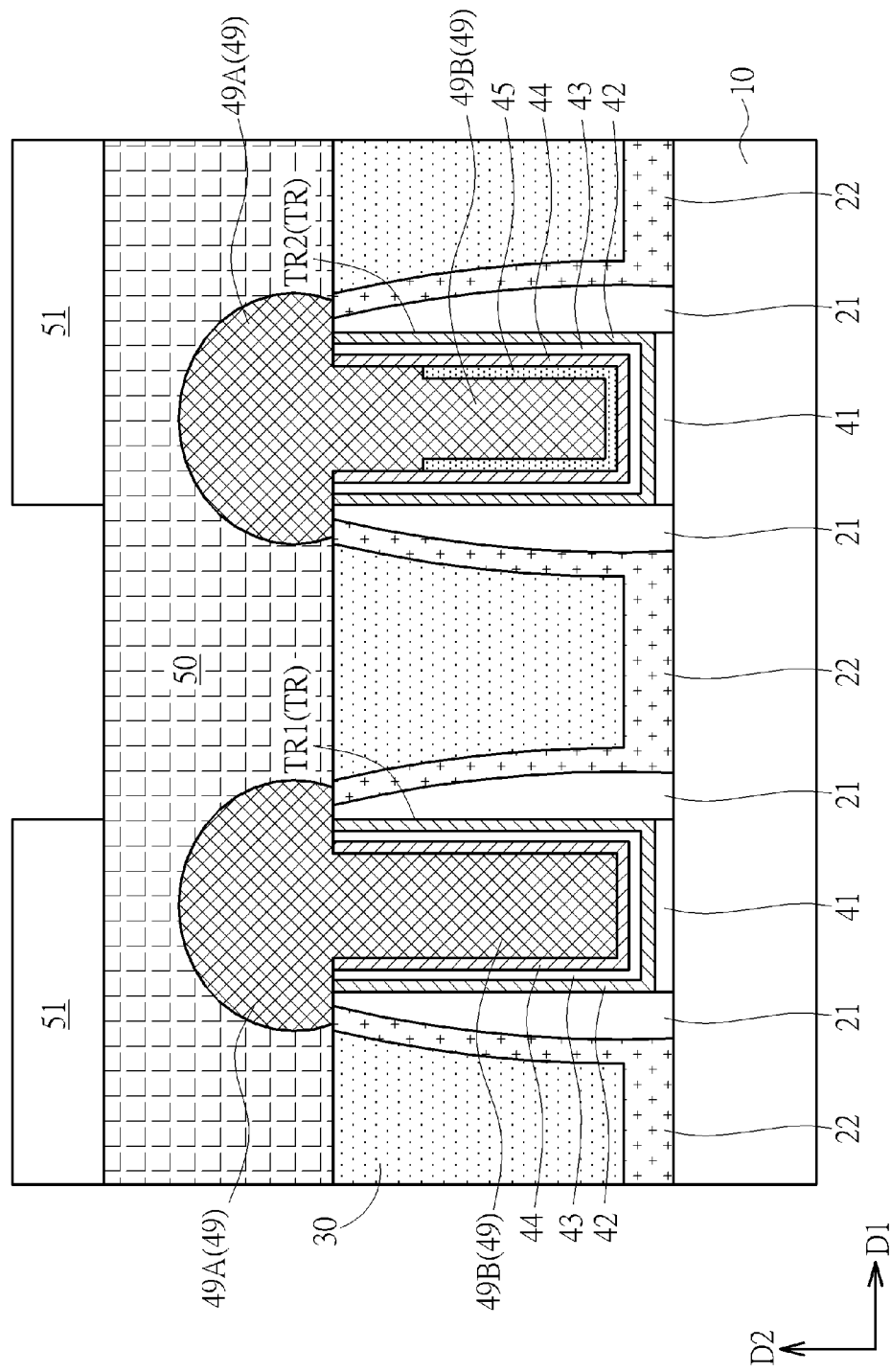
Figure 4:
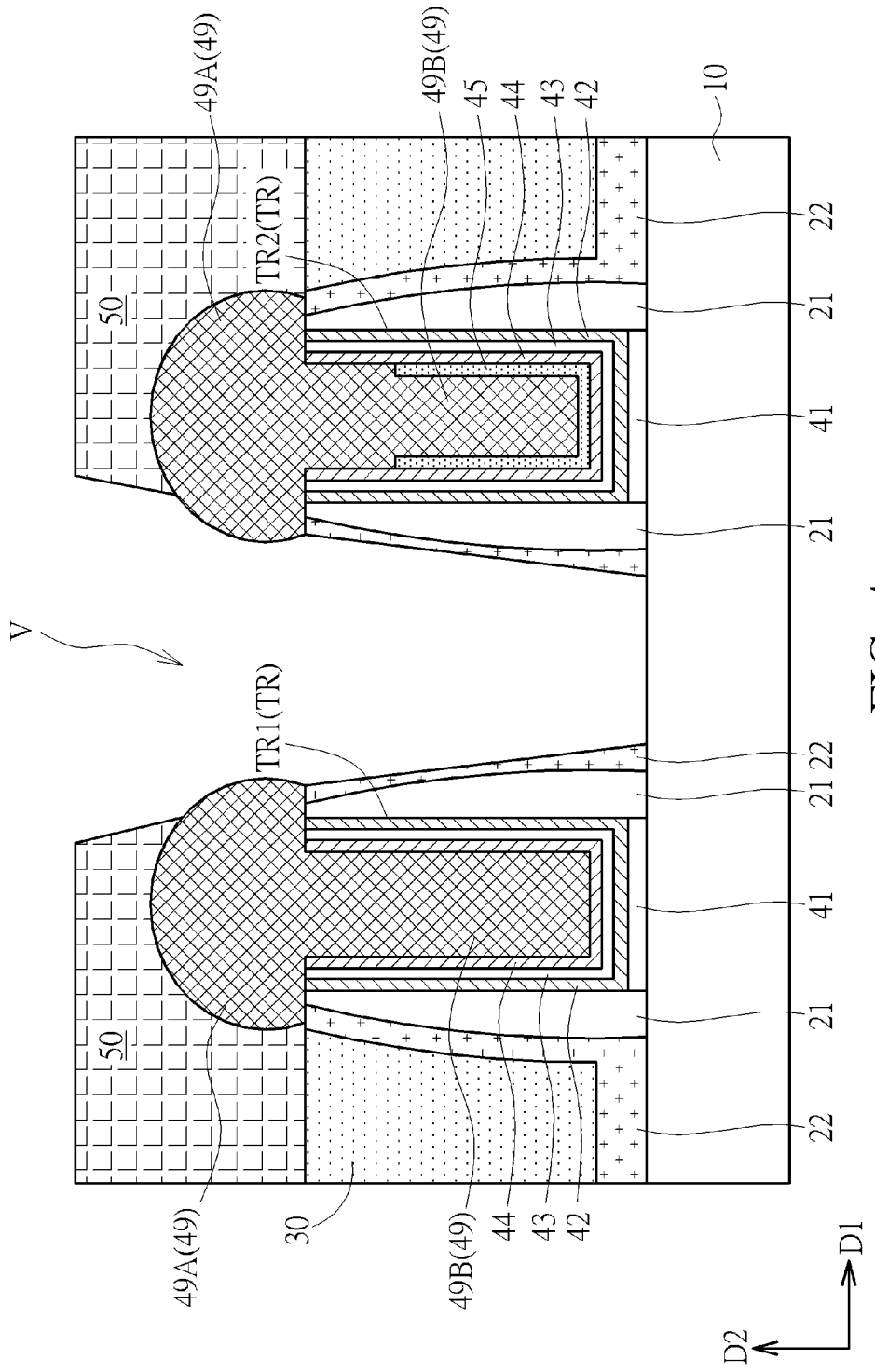

As shown in FIG. 3, a second dielectric layer 50 is formed on the first metal gate 49 and the first dielectric layer 30, and a patterned mask layer 51 is formed on the second dielectric layer 50. The first dielectric layer 30 and the second dielectric layer 50 may include silicon oxide, silicon nitride, silicon oxynitride, or other suitable insulating materials respectively. The patterned mask layer 51 may have an aperture corresponding to a region between two adjacent gate trenches TR. Subsequently, as shown in FIG. 3 and FIG. 4, the patterned mask layer 51 may be applied to perform an etching process for forming an opening V between the two adjacent gate trenches TR. In this embodiment, the opening V penetrates the second dielectric layer 50, the first dielectric layer 30, and the contact etching stop layer 22 for exposing a part of the semiconductor substrate 10, and a source/drain structure (not shown) such as a source/drain doped region may be formed in the semiconductor substrate 10 exposed by the opening V, but not limited thereto. In other embodiments of the present invention, the source/drain structure may also be formed on the semiconductor substrate between the two adjacent gate trenches TR and covered by the first dielectric layer 30, and the opening V may penetrate the first dielectric layer 30 for exposing at least a part of the source/drain structure. In other words, the opening V in this embodiment may be formed corresponding to the source/drain structure, and the source/drain structure may include an epitaxial layer, a silicide layer, a doped region in the semiconductor substrate 10, or other suitable types of source/drain structures. In addition, after the opening V is formed, the patterned mask layer 51 may be removed or kept to the subsequent process according to different considerations. It is worth noting that the upper parts 49A of the first metal gates 49 cover a part of the sidewall spacer layer 21 and a part of the contact etching stop layer 22 in the vertical direction D2 during the step of forming the opening V, such as an etching process of forming the opening V. An etching rate of the material of the first metal gate 49 in the etching process may be relatively low, the sidewall spacer layer 21 and the contact etching stop layer 22 may be kept from being over etched, and the subsequent process and the semiconductor structure subsequently formed will not be influenced accordingly. Additionally, the accuracy requirement about the size and the position of the aperture in the patterned mask layer 51 may be less strict because the upper parts 49A of the first metal gates 49 cover a part of the sidewall spacer layer 21 and a part of the contact etching stop layer 22 in etching process of forming the opening V, and the related process window may be improved accordingly.

Figure 5:
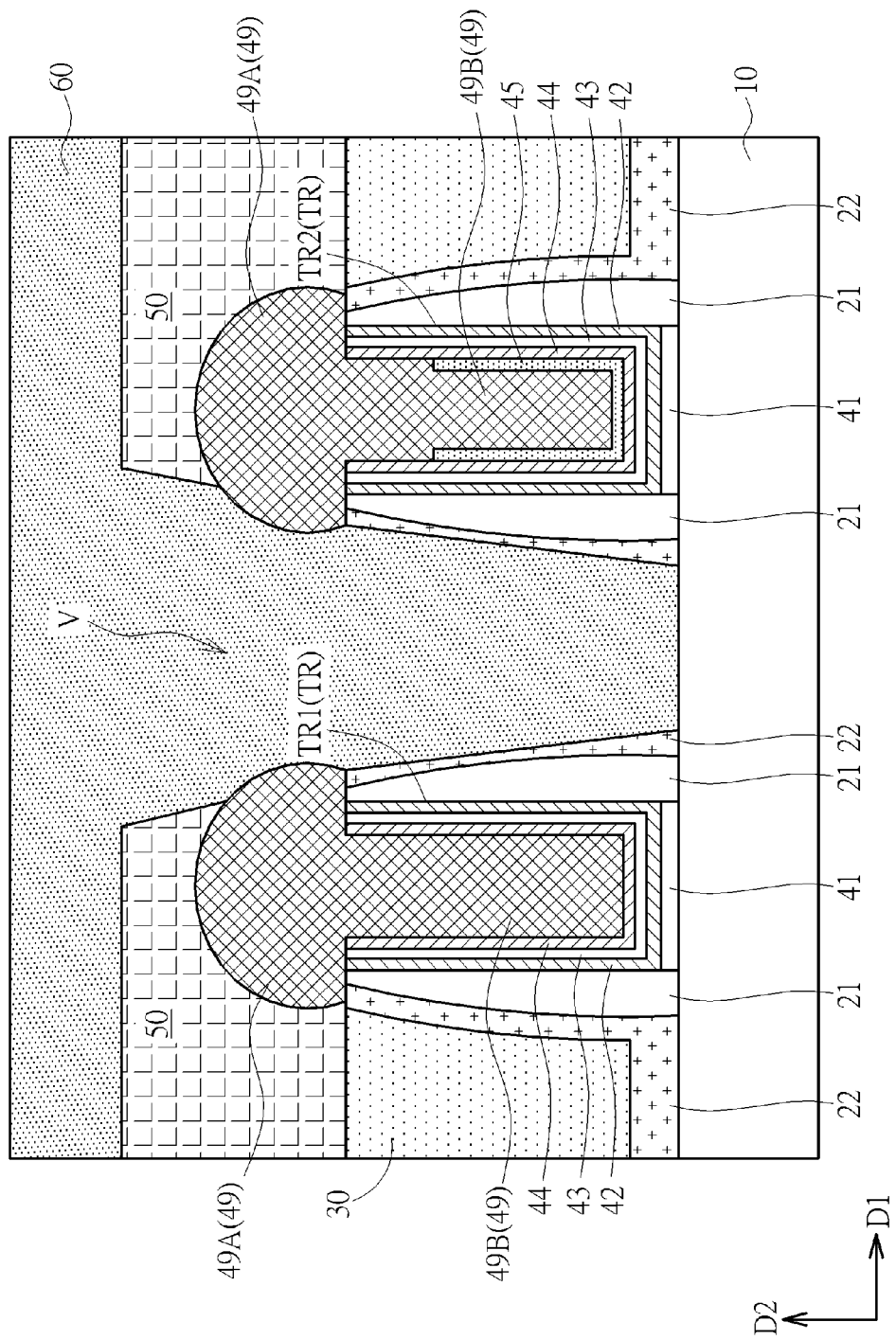
Figure 6:
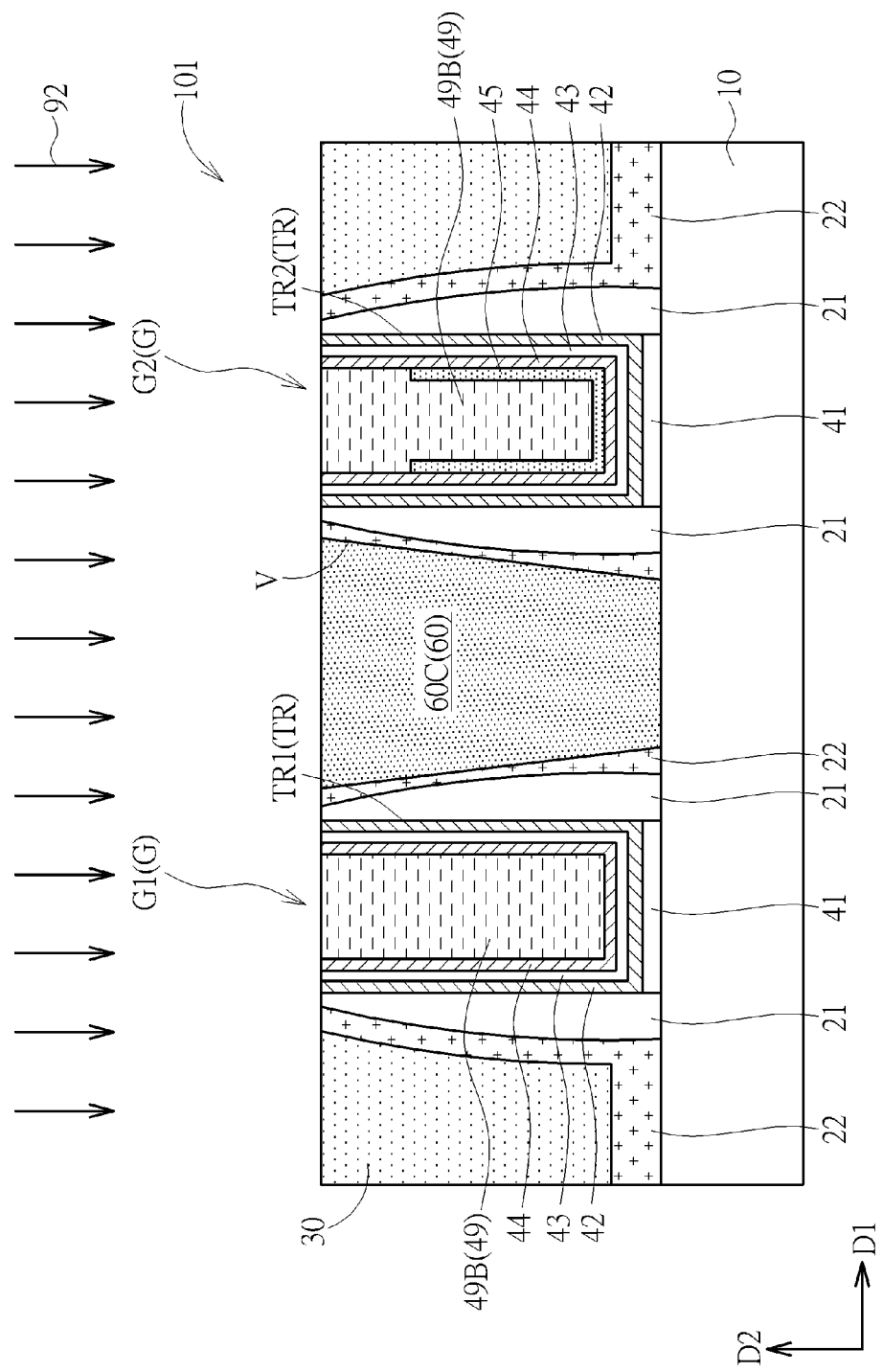

As shown in FIG. 5, a conductive material 60 is then formed in the opening V. The conductive material 60 may include metal materials such as tungsten, aluminum (Al), copper (Cu), titanium aluminide (TiAl), titanium (Ti), titanium nitride (TiN), tantalum (Ta), tantalum nitride (TaN), and titanium aluminum oxide (TiAlO), or other suitable conductive materials. For example, the conductive material 60 may include a main conductive material formed by tungsten, aluminum, or copper, and a barrier layer formed by titanium nitride or tantalum nitride, but not limited thereto. As shown in FIG. 5 and FIG. 6, the conductive material 60 may have superior gap-filling ability and the opening V may be filled with the conductive material 60. A planarization process 92 such as a chemical mechanical polish process may be performed to remove the upper parts 49A of the first metal gates 49 and a part of the conductive material 60. A self-aligned source/drain contact 60C may then be formed in the opening V between the two adjacent gate trenches TR after the planarization process 92, and the first metal gate 49 is electrically isolated from the source/drain contact 60C. A semiconductor structure 101 in FIG. 6 may be formed by the manufacturing steps described above. The semiconductor structure 101 may be regarded as a metal-oxide semiconductor field effect transistor (MOSFET), but not limited thereto. The semiconductor structure 101 includes the semiconductor substrate 10, the gate structures G, and at least one source/drain contact 60C. The gate structures G and the source/drain contact 60C are disposed on the semiconductor substrate 10, and the source/drain contact 60C is disposed between two adjacent gate structures G. The gate structures G in this embodiment may include a first gate structure G1 and a second gate structure G2, but not limited thereto. The first gate structure G1 and the second gate structure G2 may be gates of FETs with different conductivity types or gates of FETs with the same conductivity type respectively. For instance, the first gate structure G1 and the second gate structure G2 may be a gate of an N-type FET and a gate of a P-type FET respectively, but not limited thereto. Therefore, the first gate structure G1 may include the first work function layer 44 and the first metal gate 49, and the second gate structure G2 may include the first work function layer 44, the second work function layer 45, and the first metal gate 49.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
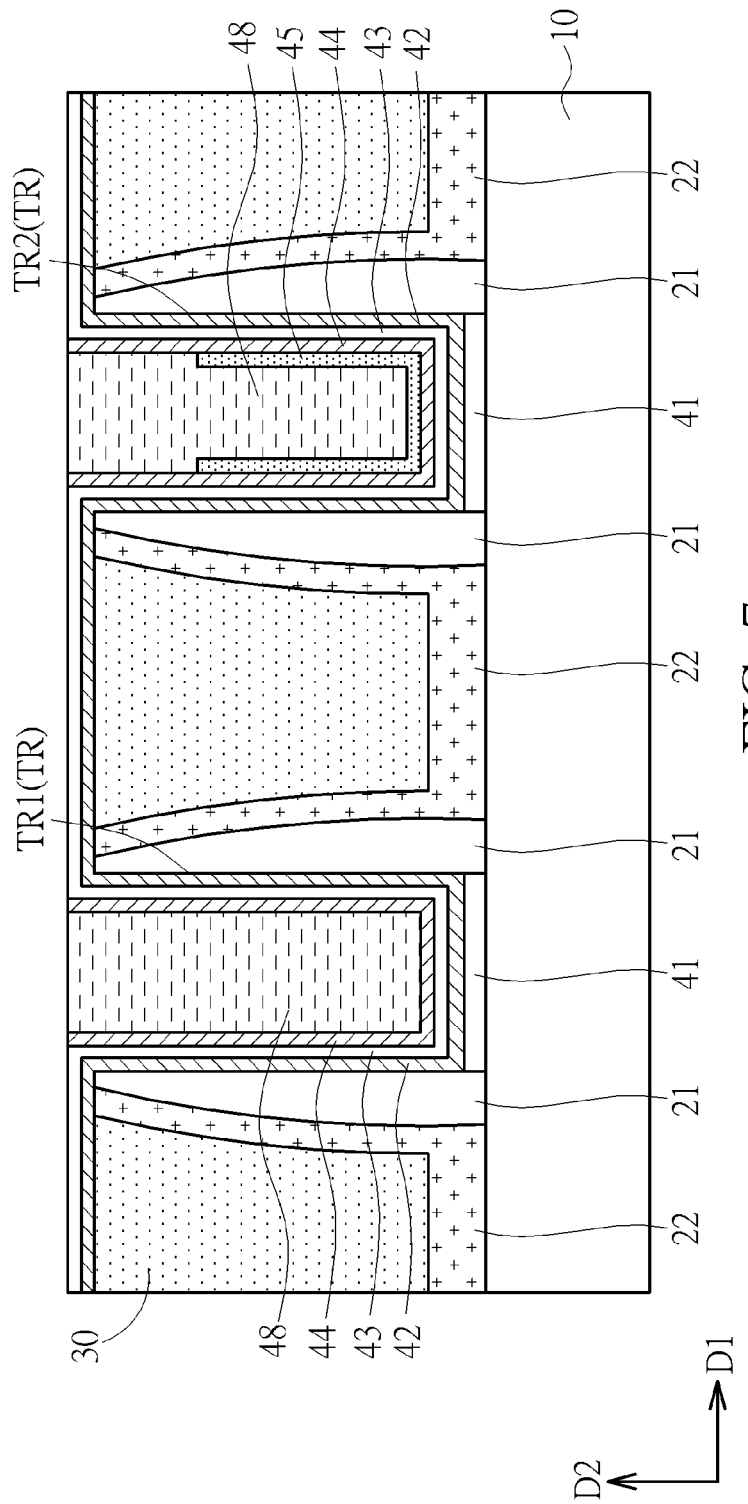
Figure 8:
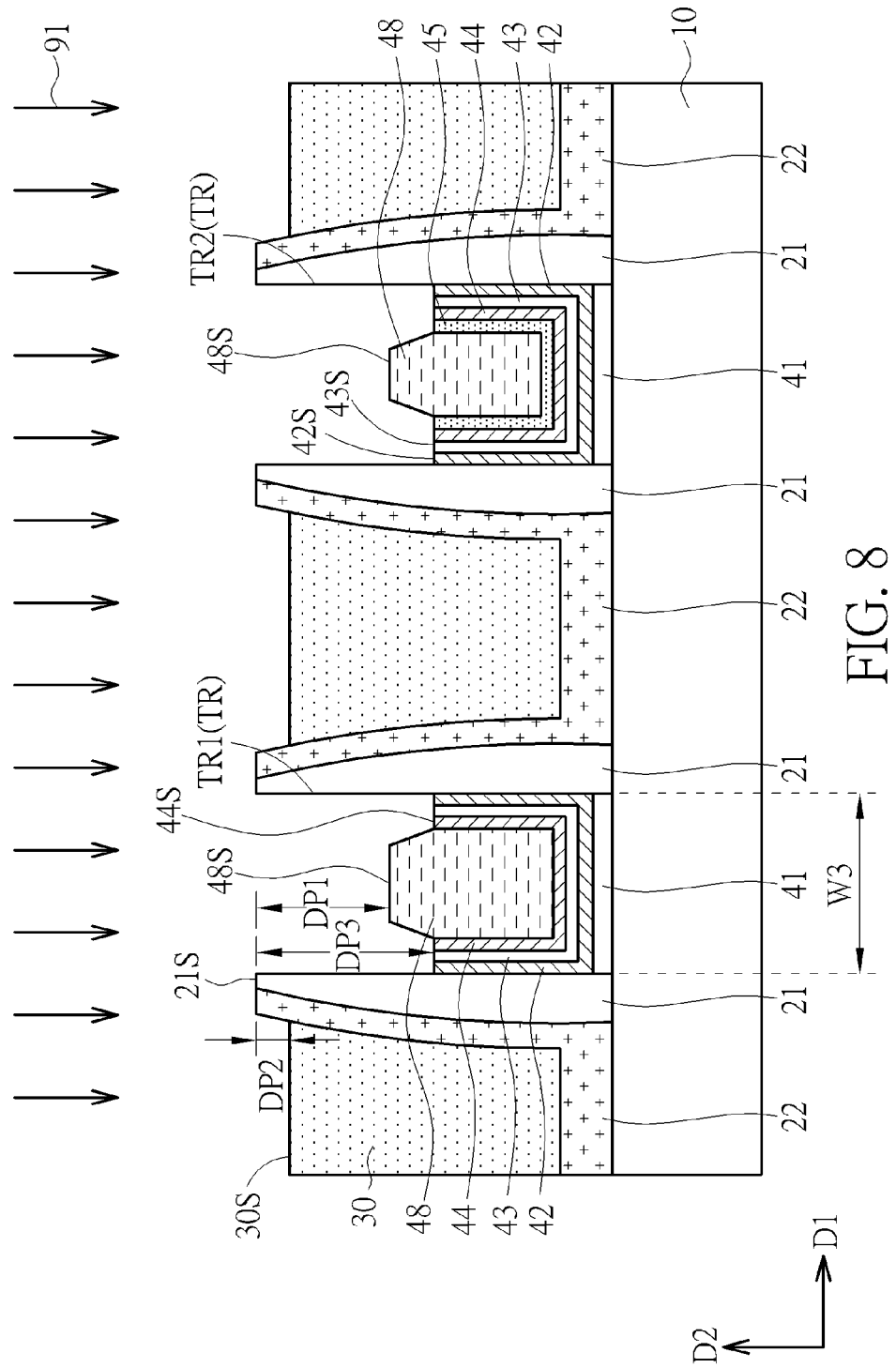

Please refer to FIGS. 7-11. FIGS. 7-11 are schematic drawings illustrating a manufacturing method of a semiconductor structure according to a second embodiment of the present invention. As shown in FIG. 7, the difference between this embodiment and the first embodiment mentioned above is that in the manufacturing method of this embodiment, a plurality of second metal gates 48 are formed on the semiconductor substrate 10 after the step of forming the first work function layer 44 and the second work function layer 45. Each of the second metal gates 48 is formed in one of the gate trenches TR. The material of the second metal gates 48 may include aluminum, tungsten, copper, titanium aluminide, or titanium aluminum oxide, but not limited thereto. As shown in FIG. 7 and FIG. 8, a recessing process 91 is then performed to recess the second metal gates 48 in the gate trenches TR. The recessing process 91 may include an etching back process with relatively lower etching rate of the sidewall spacer layer 21 and the contact etching stop layer 22, but not limited thereto. Accordingly, a topmost surface of the second metal gate 48 (such as a first topmast surface 48S shown in FIG. 8) is lower than a topmost surface of the sidewall spacer layer 21 (such as a second topmost surface 21S shown in FIG. 8) after the recessing process 91. Additionally, a planarization process may be performed optionally for removing apart of the second metal gates 48 before the recessing process 91.

In addition, the process parameters of the recessing process 91 may be modified to obtain the required etching selectivity between different material layers. For example, in the recessing process 91 in this embodiment, the second metal gate 48 may be recessed by a first recessed depth DP1; the first dielectric layer 30 may be recessed by a second recessed depth DP2; and the high-k dielectric layer 42, the barrier layer 43, and the work function layer may be recessed by a third recessed depth DP3. The third recessed depth DP3 is larger than the first recessed depth DP1, and the first recessed depth DP1 is larger than the second recessed depth DP2 preferably, but not limited thereto. The recessed depth of the material layer described above is defined as a distance between the topmost surface of the material layer and the second topmost surface 21S of the sidewall spacer layer 21 in the vertical direction D2. Accordingly, a topmost surface of the first dielectric layer 30 (such as a third topmost surface shown in FIG. 8) is lower than the second topmost surface 21S of the sidewall spacer layer 21 after the recessing process 91. Additionally, after the recessing process 91, a topmost surface of the work function layer in the gate trench TR (such as a fourth topmost surface 44S of the first work function layer 44 shown in FIG. 8), a topmost surface of the high-k dielectric layer 42 (such as a sixth topmost surface 42S shown in FIG. 8), and a topmost surface of the barrier layer 43 (such as a seventh topmost surface 43S shown in FIG. 8) are not covered by the second metal gate 48 in the gate trench TR. The fourth topmost surface 44S of the first work function layer 44, the sixth topmost surface 42S of the high-k dielectric layer 42, and the seventh topmost surface 43S of the barrier layer 43 are lower than the first topmost surface 48S of the second metal gate 48. The recessing process 91 in this embodiment may be used to recess the second metal gate 48 in the gate trench TR, but the second metal gate 48 still protrudes in comparison with other layers in the gate trench TR for performing the subsequent selective metal deposition process more conveniently.

Figure 9:
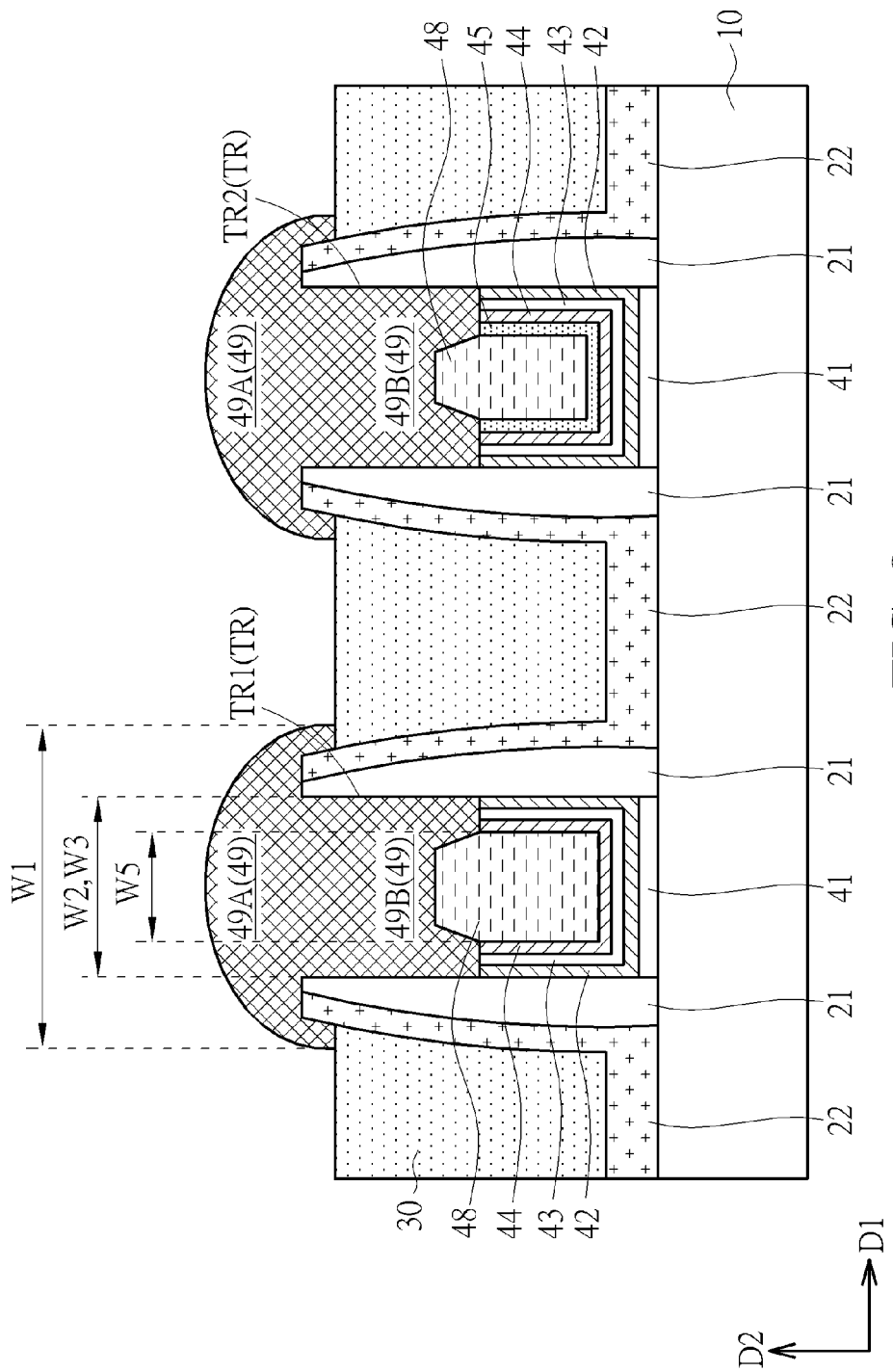

As shown in FIG. 8 and FIG. 9, after the recessing process 91, a selective metal deposition process is then performed for forming the first metal gates 49. In this embodiment, the second metal gates 48 are formed before the step of forming the first metal gates 49, the recessing process 91 is performed before the step of forming the first metal gates 49, and the first metal gates 49 are formed on the second metal gated 48 recessed by the recessing process 91. Apart from the step of forming the second metal gates 48 before the step of forming the first metal gates 49, the characteristic of the first metal gate 49 in this embodiment is similar to the first embodiment described above and will not be redundantly described. It is worth noting that the third topmost surface 30S of the first dielectric layer 30 is lower than the second topmost surface 21S of the sidewall spacer layer 21 after the recessing process 91, and the upper part 49A of the first metal gate 49 formed subsequently may further cover a part of the sidewall spacer layer 21 and the contact etching stop layer 22 in the horizontal direction D1 for providing better protection effects. In other embodiments of the present invention (such as the first embodiment mentioned above), the upper part 49A of the first metal gate 49 in the first embodiment may also cover a part of the sidewall spacer layer 21 and the contact etching stop layer 22 in the horizontal direction D1 by other approaches such as a local etching back process on the first dielectric layer 30.

Figure 10:
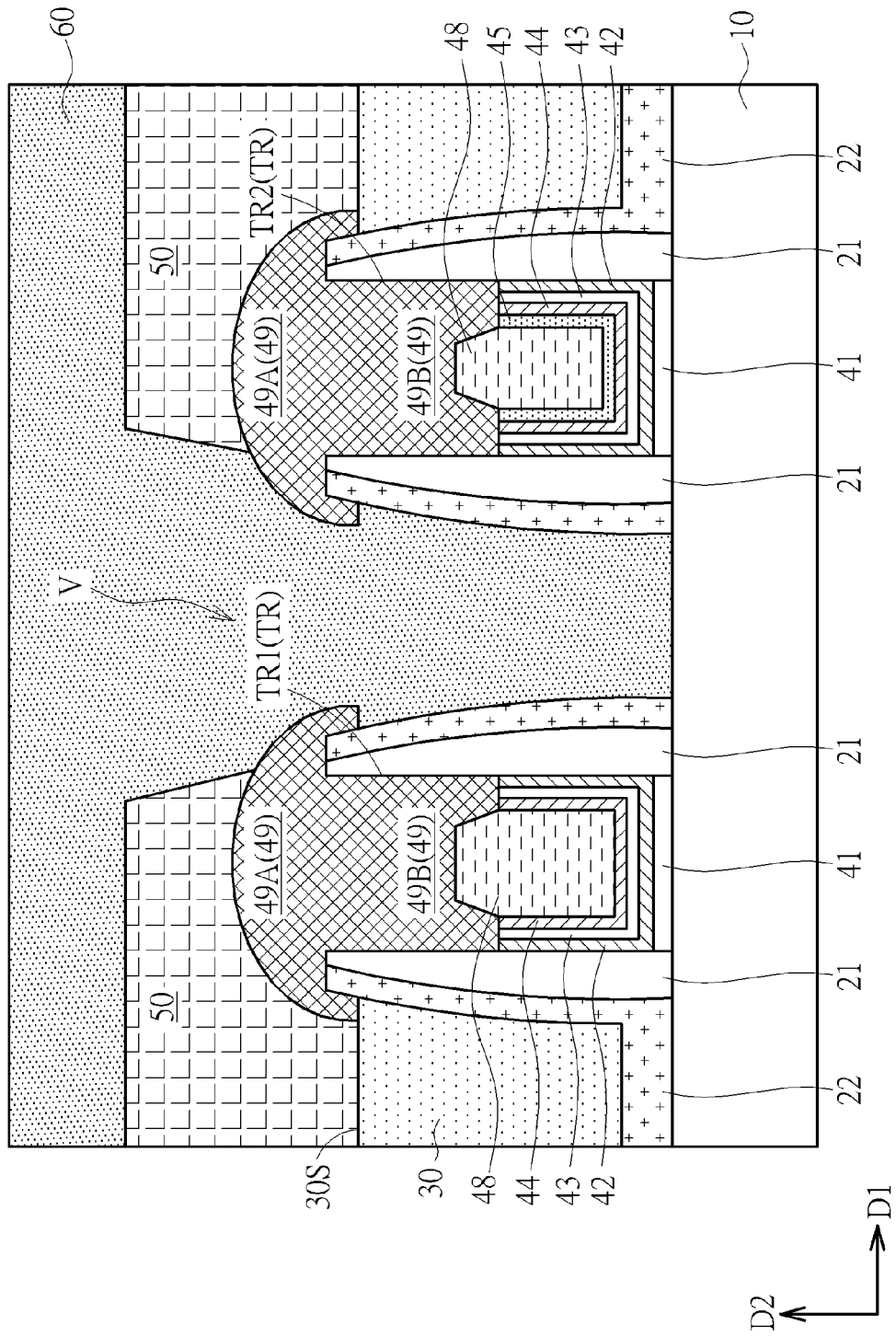
Figure 11:
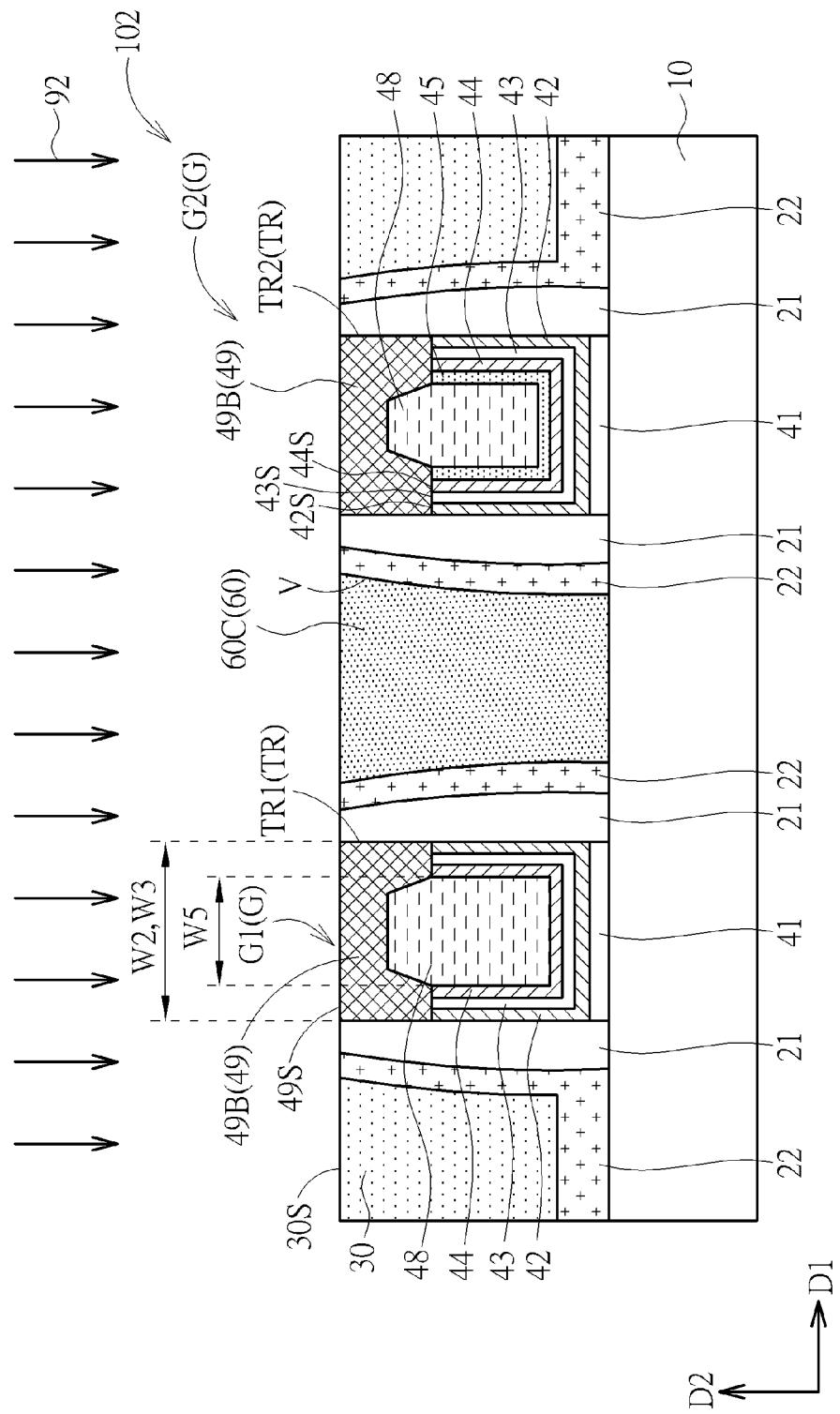

As shown in FIG. 10, similar to the manufacturing method of the first embodiment shown in FIGS. 3-5, the second dielectric layer 50 is formed on the first metal gates 49 and the first dielectric layer 30, the opening V is formed between the two adjacent gate trenches TR, and the conductive material 60 is formed in the opening V. The upper parts 49A of the first metal gates 49 covers a part of the sidewall spacer layer 21 and the contact etching stop layer 22 both in the vertical direction D2 and the horizontal direction D1 during the etching process of forming the opening V. The sidewall spacer layer 21 and the contact etching stop layer 22 may be further kept from being over etched, and the subsequent process and the semiconductor structure subsequently formed will not be influenced accordingly. As shown in FIG. 10 and FIG. 11, the planarization process 92 is performed to remove the upper parts 49A of the first metal gates 49 and a part of the conductive material 60 for forming the source/drain contact 60C in the opening V between two adjacent gate trenches TR and forming a semiconductor structure 102 shown in FIG. 11. The difference between this embodiment and the first embodiment mentioned above is that in the semiconductor structure 102 of this embodiment, the gate structure G further includes the second metal gate 48, the second metal gate 48 is disposed on the work function layer (such as the first work function layer 44), and the first metal gate 49 is disposed on the second metal gate 48. The width of the first metal gate 49 (such as the second width W2 shown in FIG. 11) is larger than a width of the second metal gate 48 (such as a fifth width W5 shown in FIG. 11), a topmost surface of the first metal gate 49 (such as a fifth topmost surface 49S shown in FIG. 11) is coplanar with the third topmost surface 30S of the first dielectric layer 30 disposed on a side of the gate structure G, and the first topmost surface 48S of the second metal gate 48 is higher than the topmost surface of the work function layer (such as the fourth topmost surface 44S of the first work function layer 44). Additionally, in this embodiment, the material of the first metal gate 49 is different from the material of the second metal gate 48 preferably. For instance, the material of the first metal gate 49 may be cobalt and the material of the second metal gate 48 may be tungsten, but not limited thereto. In the semiconductor structure 102 of this embodiment, the high-k dielectric layer 42, the barrier layer 43, and the work function layer (such as the first work function layer 44 and/or the second work function layer 45) are disposed between the second metal gate 48 and the semiconductor substrate 10. The high-k dielectric layer 42, the barrier layer 43, and the work function layer may include a U-shaped high-k dielectric layer, a U-shaped barrier layer, and a U-shaped work function layer respectively. The sixth topmost surface 42S of the high-k dielectric layer 42, the seventh topmost surface 43S of the barrier layer 43, and the fourth topmost surface 44S of the first work function layer 44 are covered by the first metal gate 49. The sixth topmost surface 42S, the seventh topmost surface 43S, and the fourth topmost surface 44S are not covered by the second metal gate 48. The sixth topmost surface 42S, the seventh topmost surface 43S, and the fourth topmost surface 44S are lower than the first topmost surface 48S of the second metal gate 48. In this embodiment, the high-k dielectric layer 42 is formed by a high-k last method, but the present invention is not limited to this. In other embodiments of the present invention, the high-k dielectric layer 42 may also be formed by a high-k first method according to other considerations.

Figure 12:
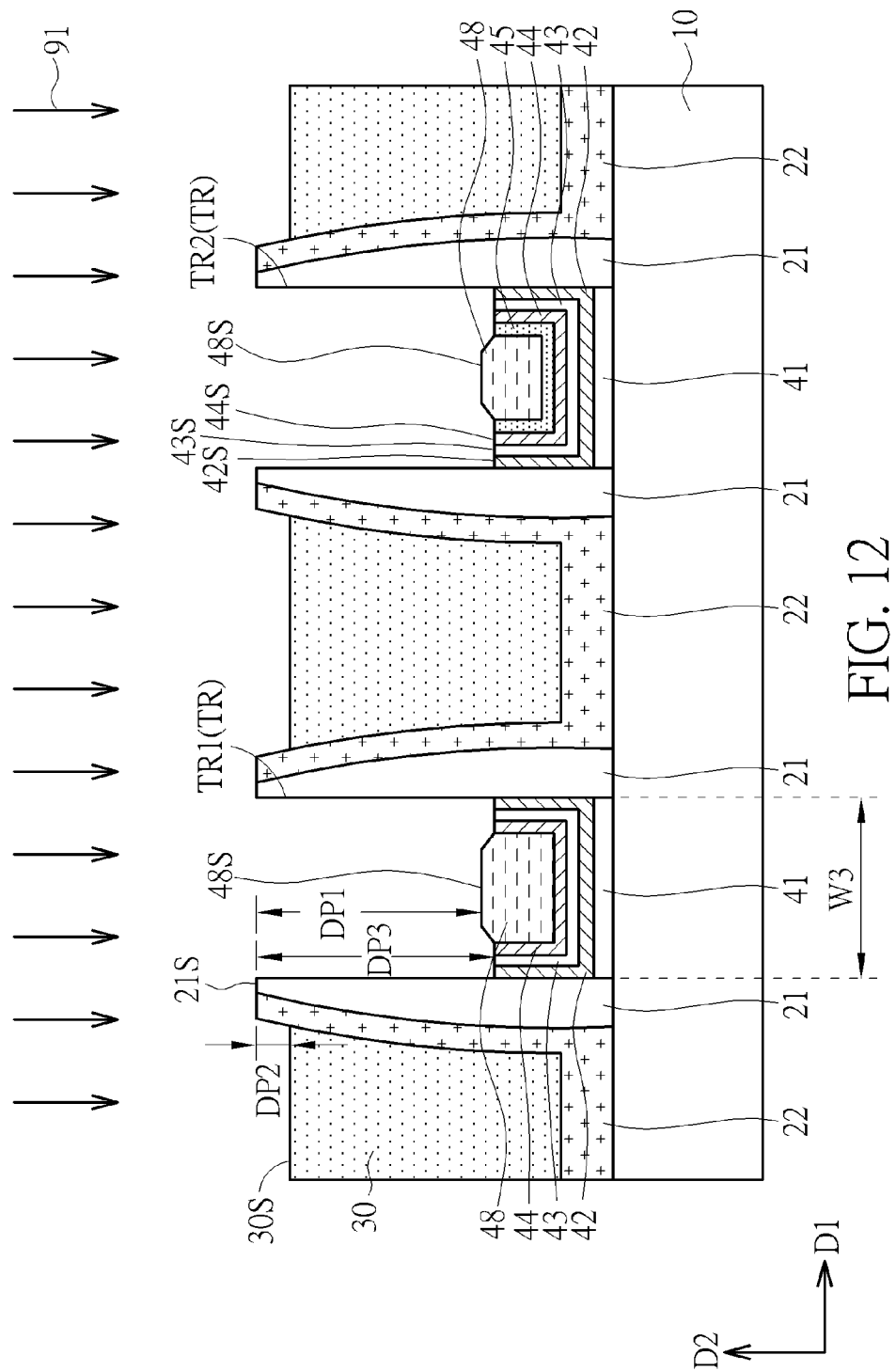
Figure 13:
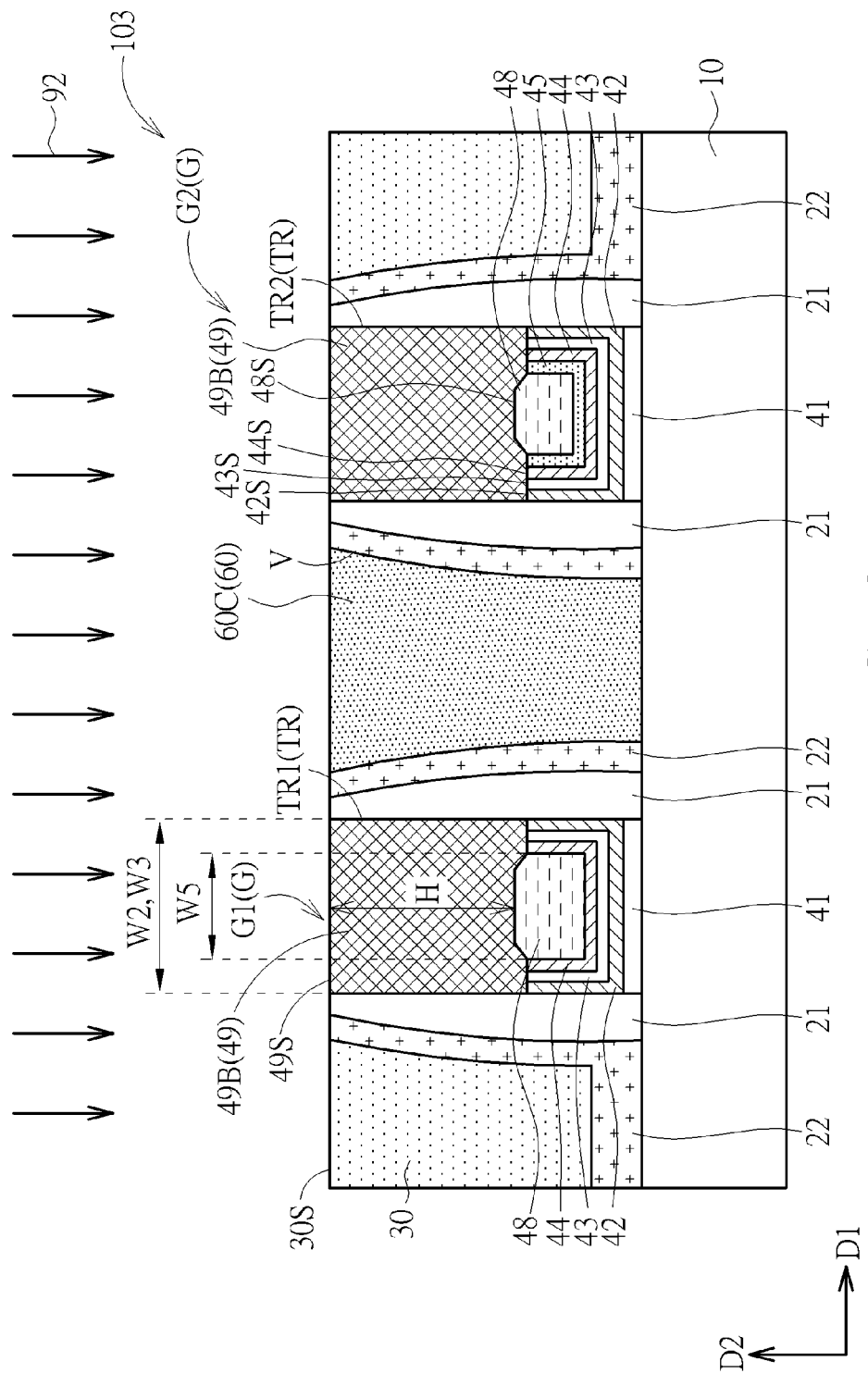

Please refer to FIG. 12 and FIG. 13. FIG. 12 and FIG. 13 are schematic drawings illustrating a manufacturing method of a semiconductor structure according to a third embodiment of the present invention. As shown in FIG. 12, the difference between this embodiment and the second embodiment mentioned above is that a recessed depth of each of the second metal gates 48 in the gate trenches TR (such as the first recessed depth DP1 shown in FIG. 12) is larger than the width of the gate trench TR (such as the third width W3 shown in FIG. 12) after the recessing process 91 in this embodiment. Accordingly, as shown in FIG. 13, a semiconductor structure 103 of this embodiment may be formed after the steps of forming the first metal gates 49 and the source/drain contact 60C and the planarization process 92. In the semiconductor structure 103, a height H of each of the first metal gates 49 in the gate trenches TR is larger than the third width W3 of the gate trench TR, and the height H of the first metal gate 49 in the vertical direction D2 is larger than the second width W2 of the first metal gate 49 in the horizontal direction D1. According to the manufacturing method of this embodiment, the lower part 49B of the first metal gate 49 may extend further deeply into the gate trench TR, the stability of the first metal gate 49 formed by the selective metal deposition process may be enhanced, and the peeling risk of the first metal gate 49 in other processes (such as the planarization process 92 described above) may become lowered accordingly.

Figure 14:
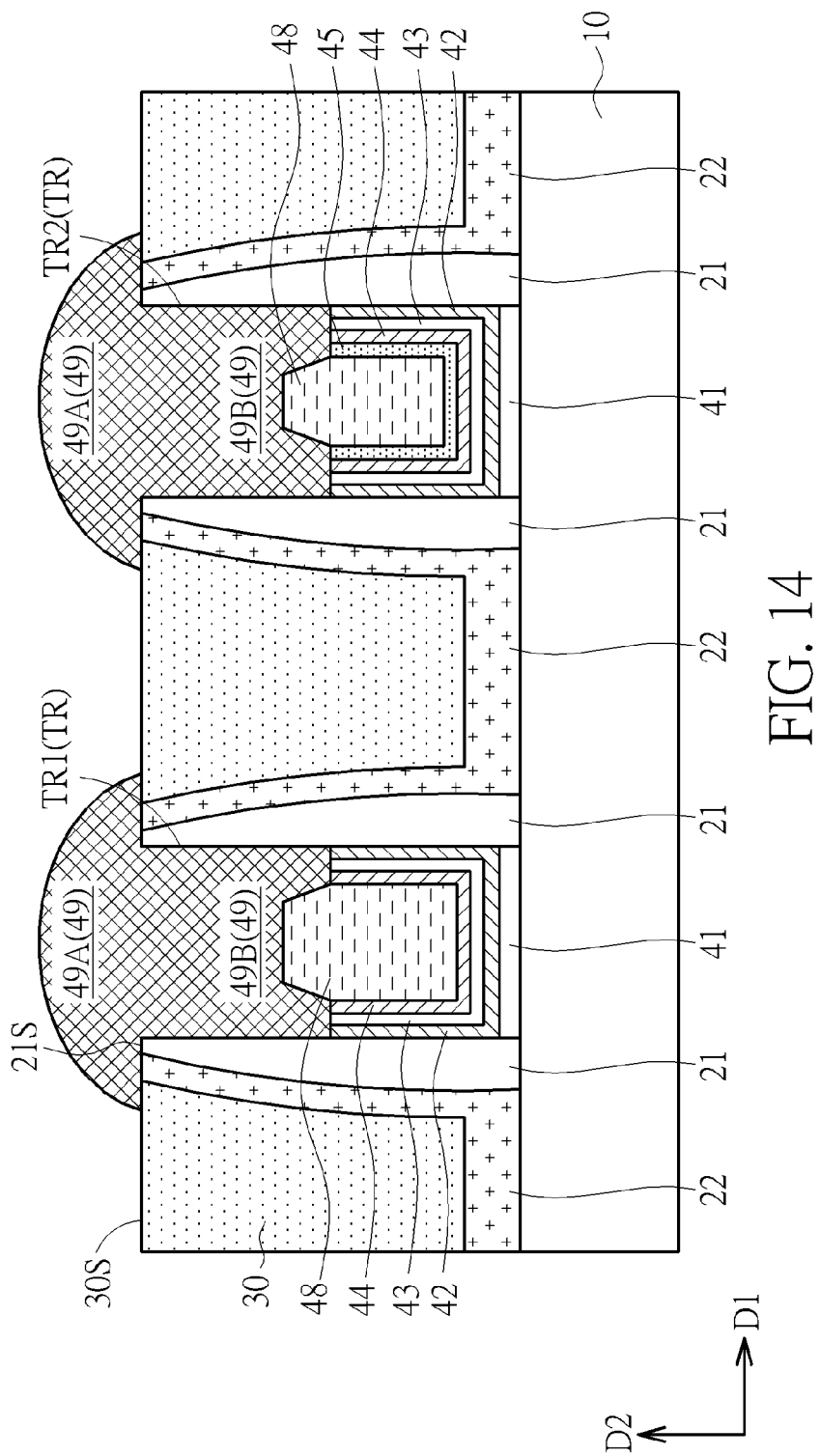
FIG. 14 is a schematic drawing illustrating a manufacturing method of a semiconductor structure according to a fourth embodiment of the present invention.

Please refer to FIG. 14. FIG. 14 is a schematic drawing illustrating a manufacturing method of a semiconductor structure according to a fourth embodiment of the present invention. As shown in FIG. 14, the difference between this embodiment and the second embodiment mentioned above is that the third topmost surface 30S of the first dielectric layer 30 in this embodiment may be substantially coplanar with the second topmost surface 21S of the sidewall spacer layer 21 after the recessing process and before the planarization process for removing the upper parts 49A of the first metal gates 49. It is helpful to the control of the recessing process because the first dielectric layer 30 does not have to be etched in the recessing process and the recessing process may be focused on etching the materials in the gate trenches TR.

To summarize the above descriptions, in the manufacturing method of the semiconductor structure in the present invention, the upper part of the first metal gate formed by the selective metal deposition process covers the sidewall spacer layer so as to protect the sidewall spacer layer in the subsequent process of forming the source/drain contact. The sidewall spacer layer will not be over etched, and a short circuit between the gate structure and the source/drain contact may be avoided accordingly. In addition, the alignment accuracy requirement of the patterning process for forming the self-aligned source/drain contact may be less strict because the upper parts of the first metal gates cover a part of the sidewall spacer layer, and the related process window may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
   forming a plurality of gate trenches in a first dielectric layer on a semiconductor substrate, wherein a sidewall spacer layer is formed on the semiconductor substrate and on at least two sides of each gate trench;
   forming a plurality of first metal gates on the semiconductor substrate, wherein each of the first metal gates comprises an upper part and a lower part connected to the upper part, the lower part is formed in one of the gate trenches, and the upper part covers at least a part of the sidewall spacer layer in a vertical direction, wherein the upper part and the lower part of the first metal gate are formed by an identical process together; and
   forming a source/drain contact between two adjacent gate trenches, wherein the first dielectric layer is formed between the gate trenches, and the step of forming the source/drain contact comprises:
      forming a second dielectric layer on the first metal gates and the first dielectric layer;
      forming an opening between the two adjacent gate trenches, wherein the opening penetrates the second dielectric layer and the first dielectric layer, and the upper parts of the first metal gates cover a part of the sidewall spacer layer in the vertical direction during the step of forming the opening; and
      forming a conductive material in the opening.

2. The manufacturing method of claim 1, wherein the first metal gates are formed by a selective metal deposition process.

3. The manufacturing method of claim 2, wherein a material of the first metal gates formed by the selective metal deposition process comprises at least one of cobalt, manganese, chromium, iron, nickel, ruthenium, molybdenum, or tungsten.

4. The manufacturing method of claim 1, wherein the upper part and the lower part of the first metal gate are formed monolithically and connected with one another.

5. The manufacturing method of claim 1, wherein a width of the upper part is larger than a width of the lower part, and the width of the upper part is larger than a width of the gate trench.

6. The manufacturing method of claim 1, wherein the step of forming the source/drain contact further comprises:
   performing a planarization process to remove the upper parts of the first metal gates and a part of the conductive material, wherein the source/drain contact is formed in the opening after the planarization process, and the first metal gates are electrically isolated from the source/drain contact after the planarization process.

7. The manufacturing method of claim 1, further comprising:
   forming a plurality of second metal gates on the semiconductor substrate before the step of forming the first metal gates, wherein each of the second metal gates is formed in one of the gate trenches, and the first metal gates are formed on the second metal gates.

8. The manufacturing method of claim 7, further comprising:
   performing a recessing process to recess the second metal gates in the gate trenches before the step of forming the first metal gates, wherein a topmost surface of the second metal gate is lower than a topmost surface of the sidewall spacer layer after the recessing process.

9. The manufacturing method of claim 8, wherein the first dielectric layer is formed between the gate trenches, and a topmost surface of the first dielectric layer is lower than the topmost surface of the sidewall spacer layer after the recessing process.

10. The manufacturing method of claim 9, wherein the upper part of the first metal gate further covers a part of the sidewall spacer layer in a horizontal direction.

11. The manufacturing method of claim 8, further comprising:
    forming a work function layer in the gate trenches before the step of forming the second metal gates, wherein a part of a topmost surface of the work function layer is not covered by the second metal gate in the gate trench after the recessing process, and the topmost surface of the work function layer is lower than the topmost surface of the second metal gate.

12. The manufacturing method of claim 8, wherein a recessed depth of each of the second metal gates in the gate trenches is larger than a width of the gate trench.

13. The manufacturing method of claim 8, wherein a height of each of the first metal gates in the gate trenches is larger than a width of the gate trench.

14. A semiconductor structure, comprising:
    a semiconductor substrate; and
    a gate structure disposed on the semiconductor substrate, wherein the gate structure comprises:
       a work function layer;
       a second metal gate disposed on the work function layer;
       a first metal gate disposed on the second metal gate, wherein a width of the first metal gate is larger than a width of the second metal gate, a topmost surface of the first metal gate is coplanar with a topmost surface of a first dielectric layer disposed on a side of the gate structure, and a topmost surface of the second metal gate is higher than a topmost surface of the work function layer; and
       a high-k dielectric layer disposed between the second metal gate and the semiconductor substrate, wherein the high-k dielectric layer comprises a U-shaped high-k dielectric layer, a topmost surface of the high-k dielectric layer is not covered by the second metal gate, and the topmost surface of the high-k dielectric layer is lower than the topmost surface of the second metal gate.

15. The semiconductor structure of claim 14, wherein a height of the first metal gate is larger than the width of the first metal gate.

16. The semiconductor structure of claim 14, wherein a material of the first metal gate is different from a material of the second metal gate.

17. The semiconductor structure of claim 14, further comprising:
  a barrier layer disposed between the second metal gate and the semiconductor substrate, wherein the barrier layer comprises a U-shaped barrier layer, a topmost surface of the barrier layer is not covered by the second metal gate, and the topmost surface of the barrier layer is lower than the topmost surface of the second metal gate.

18. A semiconductor structure, comprising:
  a semiconductor substrate; and
  a gate structure disposed on the semiconductor substrate, wherein the gate structure comprises:
    a work function layer;
    a second metal gate disposed on the work function layer;
    a first metal gate disposed on the second metal gate, wherein a width of the first metal gate is larger than a width of the second metal gate, a topmost surface of the first metal gate is coplanar with a topmost surface of a first dielectric layer disposed on a side of the gate structure, and a topmost surface of the second metal gate is higher than a topmost surface of the work function layer; and
  a barrier layer disposed between the second metal gate and the semiconductor substrate, wherein the barrier layer comprises a U-shaped barrier layer, a topmost surface of the barrier layer is not covered by the second metal gate, and the topmost surface of the barrier layer is lower than the topmost surface of the second metal gate.

19. The semiconductor structure of claim 18, wherein a height of the first metal gate is larger than the width of the first metal gate.

20. The semiconductor structure of claim 18, further comprising:
  a high-k dielectric layer disposed between the second metal gate and the semiconductor substrate, wherein the high-k dielectric layer comprises a U-shaped high-k dielectric layer, a topmost surface of the high-k dielectric layer is not covered by the second metal gate, and the topmost surface of the high-k dielectric layer is lower than the topmost surface of the second metal gate.

* * * * *